(12) United States Patent
Gorobets et al.

(10) Patent No.: US 7,719,890 B2
(45) Date of Patent: May 18, 2010

(54) DATA PROTECTION FOR WRITE ABORT

(75) Inventors: Sergey A. Gorobets, Edinburgh (GB); Shai Traister, San Jose, CA (US); Jason T. Lin, Santa Clara, CA (US); Alan D. Bennett, Edinburgh (GB); Neil D. Hutchison, Stirlingshire (GB)

(73) Assignee: SanDisk Corporation, Milpitas, CA (US)

( * ) Notice: Subject to any disclaimer, the term of this patent is extended or adjusted under 35 U.S.C. 154(b) by 107 days.

(21) Appl. No.: 12/025,937

(22) Filed: Feb. 5, 2008

(65) Prior Publication Data

US 2009/0067241 A1    Mar. 12, 2009

Related U.S. Application Data

(60) Provisional application No. 60/971,774, filed on Sep. 12, 2007.

(51) Int. Cl.
  *G11C 16/04* (2006.01)
(52) U.S. Cl. .............. 365/185.04; 365/230.07; 365/189.011; 365/189.16; 365/185.09
(58) Field of Classification Search ............ 365/185.04, 365/185.09, 185.33, 189.16, 189.011, 230.1; 711/156
See application file for complete search history.

(56) References Cited

U.S. PATENT DOCUMENTS

| | | | | |
|---|---|---|---|---|
| 5,657,332 A | 8/1997 | Auclair et al. | ............ | 371/40.11 |
| 6,282,130 B1 | 8/2001 | Cernea et al. | .......... | 365/189.09 |
| 6,456,528 B1 | 9/2002 | Chen | .................... | 365/185.03 |
| 6,522,580 B2 | 2/2003 | Chen | .................... | 365/185.02 |
| 6,678,785 B2 | 1/2004 | Lasser | ......................... | 711/103 |
| 6,771,536 B2 | 8/2004 | Li et al. | ................. | 365/185.02 |
| 6,977,847 B2 * | 12/2005 | Lasser et al. | ........... | 365/185.33 |
| 6,988,175 B2 * | 1/2006 | Lasser | ........................ | 711/156 |
| 7,139,864 B2 | 11/2006 | Bennett et al. | ............. | 711/159 |
| 7,173,852 B2 | 2/2007 | Gorobets et al. | ....... | 365/185.09 |
| 7,315,916 B2 | 1/2008 | Bennett et al. | ............. | 711/103 |
| 2005/0141362 A1 | 6/2005 | Lin et al. | .................... | 711/103 |
| 2005/0144367 A1 | 6/2005 | Sinclair et al. | ............. | 711/103 |
| 2006/0155922 A1 | 7/2006 | Gorobets et al. | ............ | 711/103 |

(Continued)

OTHER PUBLICATIONS

U.S. Appl. No. 60/971,744, filed Sep. 12, 2007, Gorobets et al.

*Primary Examiner*—Pho M Luu
*Assistant Examiner*—Tha-O Bui
(74) *Attorney, Agent, or Firm*—Weaver Austin Villeneuve Sampson LLP

(57) ABSTRACT

A portion of a nonvolatile memory array that is likely to contain, partially programmed data may be identified from a high sensitivity read, by applying stricter than usual ECC requirements, or using pointers to programmed sectors. The last programmed data may be treated as likely to be partially programmed data. Data in the identified portion may be copied to another location, or left where it is with an indicator to prohibit further programming to the same cells. To avoid compromising previously stored data during subsequent programming, previously stored data may be backed up. Backing up may be done selectively, for example, only for nonsequential data, or only when the previously stored data contains an earlier version of data being programmed. If a backup copy already exists, another backup copy is not created. Sequential commands are treated as a single command if received within a predetermined time period.

12 Claims, 7 Drawing Sheets

U.S. PATENT DOCUMENTS

| | | |
|---|---|---|
| 2006/0259718 A1 | 11/2006 | Paley .................... 711/159 |
| 2007/0113029 A1 | 5/2007 | Bennett et al. ............ 711/159 |
| 2009/0070521 A1 | 3/2009 | Gorobets et al. |
| 2009/0070529 A1 | 3/2009 | Mee et al. |
| 2009/0070748 A1 | 3/2009 | Lin et al. |

* cited by examiner

DATA PROTECTION FOR WRITE ABORT

CROSS REFERENCE TO RELATED APPLICATION

This application claims the benefit of U.S. Provisional Application No. 60/971,774, filed on Sep. 12, 2007 entitled "Write Abort and Erase Abort Handling Systems and Methods in Nonvolatile Memory," by Sergey A. Gorobets et al. This application is incorporated in its entirety by reference as if fully set forth herein.

FIELD OF THE INVENTION

This invention relates generally to a nonvolatile memory and its operation, and, more specifically, to detecting and handling of aborted write and erase operations in nonvolatile memory systems.

BACKGROUND OF THE INVENTION

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses received by the memory sub-system from a host, and physical addresses within the memory cell array. This translation often involves use of intermediate terms for a logical block number (LBN) and logical page. The controller also manages the low-level flash circuit operation through a series of commands that it issues to the flash memory devices via an interface bus. Another function the controller performs is to maintain the integrity of data stored to the subsystem through various means, such as by using an error correction code (ECC).

In case of a power outage during operation of such a memory circuit, for example if a memory card is removed from a host or a power is lost to a device with an integrated memory, the memory may be caught in the middle of a write or erase operation, resulting in an incomplete operation. For example, if a memory system loses power during a programming (writing) process when most, but not all, of the cells in a group being written have reached their target state, the write group may contain a large number of errors (the terms "write" and "program" are used interchangeably here). As is familiar in the art, it is common to incorporate error correction code (ECC) into memory systems to determine and correct data errors. A power outage before completion of a programming operation can cause the write group to be in three situations when the interrupted write group is read: (1) it is correctable by ECC; (2) it is uncorrectable by ECC; and (3) an ECC mis-detect can occur. In the first case, the extent of the error is minor enough where the error correction code can salvage the data. In the second case, the data will be incorrect, but the system will determine this condition. In the third case, the data will again be incorrect, but, due to an ECC mis-detect, the system is unaware of the situation.

In case (1), even though the data is correctable by ECC, the data may be unreliable and may become corrupt under certain conditions (e.g. different temperature, after further programming of same or neighboring cells etc.). For example, where ECC can correct four bits, data containing four erroneous bits is correctable, but if the data is unreliable it may become further corrupted so that it has five or more erroneous bits and is not correctable by ECC. Similar situations can occur if power loss occurs during an erase process. These scenarios make ECC write and erase abort detection far from perfect and are particularly troublesome for mission critical situations where it is important to know if the data has been correctly entered. Consequently, there is room for improvement in this aspect of memory systems. Furthermore, when an aborted write or erase is detected, it is generally desirable to recover in an efficient manner. Thus, there is a need for methods of efficiently handling cells that are, or are likely to be, partially programmed or erased.

SUMMARY OF THE INVENTION

A method of selectively protecting data stored in a nonvolatile memory array according to an embodiment of the present invention includes: determining whether writing of an addressable unit of data having a first logical address to the nonvolatile memory array would endanger previously stored data in the nonvolatile memory array if the first addressable unit of data was stored in a first location; if the writing would endanger the previously stored data, then further determining if the endangered previously stored data contains, or is likely to contain, an earlier copy of the addressable unit of data having the first logical address; and selecting a data protection scheme for protecting the endangered previously stored data according to the further determination.

A method of handling data in a nonvolatile memory that is likely to include unreliable data according to another embodiment includes: in response to receiving power to the nonvolatile memory array, after a period without power, identifying a portion of the nonvolatile memory array that was last programmed prior to the period without power; and in response to identifying the portion of the nonvolatile memory array as the last programmed portion, copying the data stored in the portion of the nonvolatile memory array from the identified portion of the nonvolatile memory array to another portion of the nonvolatile memory array, regardless of whether the data is indicated by ECC to be acceptable or not.

A method of identifying portions of a nonvolatile memory that are likely to contain unreliable data according to an embodiment includes: providing a first pointer that points to a first addressable unit of data that has a first logical address that is a logically first address of a sequence of logical addresses of units of data associated with a command or command sequence; providing a second pointer that points to a second addressable unit of data that has a second logical address that is a logically last address of the sequence of logical addresses; storing the first pointer and the second pointer in a location in the nonvolatile memory that is removed from a location storing the first and second units of data; and during a power-up routine, searching for the first pointer and the second pointer to ensure that all of the units of data associated with the command or command sequence were programmed.

A method of identifying portions of a nonvolatile memory array that contain unreliable data due to aborted write operations, according to an embodiment, comprises: making an initial determination as to whether a first unit of data and a second unit of data are likely to individually contain unreliable data due to power loss during programming; in response to determining that the first unit of data is not likely to contain unreliable data due to power loss during programming, performing ECC decoding to determine a first number of errors in the first unit of data; comparing the first number to a first threshold value to determine if the first unit of data is acceptable; in response to determining that the second unit of data is likely to contain unreliable data due to power loss during programming, performing ECC decoding to determine a second number of errors in the second unit of data; and comparing the second number to a second threshold value to determine if the second unit of data is acceptable, the second number being lower than the first number.

A method of identifying units of data in a nonvolatile memory array that contain unreliable data due to aborted write operations, according to an embodiment, includes: making an initial determination as to whether a first unit of data and a second unit of data are likely to individually contain unreliable data due to power loss during programming; in response to determining that the first unit of data is not likely to contain unreliable data due to power loss during programming, reading the first unit of data using a first set of read parameters; and in response to determining that the second unit of data is likely to contain unreliable data due to power loss during programming, reading the second unit of data using a second set of read parameters, the second set of read parameters providing higher sensitivity than the first set of read parameters.

A method of handling multi-level cells that are likely to contain marginally programmed data due to an aborted write operation in a nonvolatile memory array, according to an embodiment, comprises: identifying lower page data within a physical page of the nonvolatile memory array as likely to contain marginally programmed data due to an aborted write command, the physical page having unused capacity for upper page data; and in response to the identifying of the lower page as likely to contain marginally programmed data, maintaining the identified lower page data in the physical page and marking the upper page as not being usable so that subsequent writes to the upper page are prohibited.

DETAILED DESCRIPTION OF ILLUSTRATED EMBODIMENTS

With reference to FIGS. 1-5, a specific nonvolatile memory system is described in which the various aspects of the present invention may be implemented, in order to provide specific examples. Aspects of the present invention may also be implemented in other memory systems. To reduce the amount of disturb in erase processes, the memory system of FIGS. 1-5 maintains the control gates of non-selected storage elements at the same voltage level as their underlying well structure. In a exemplary embodiment, the storage elements are formed over a well structure. During an erase process, both the selected and non-selected storage elements over the well are raised to an erase voltage concurrently with establishing this voltage level in the well. This voltage is then held on the well and the non-selected storage elements, thereby reducing the chance of any erase related disturbs, while the selected storage elements are allowed to discharge, producing the needed erase conditions. Further, this can be accomplished without increasing any pitch area of circuit or adding new wires in the memory array, resulting in minimal additional peripheral area being added to the circuit.

For specificity, the present invention is described for an EEPROM flash memory of the NAND type, although generalizations will be discussed further below. In particular, the present exposition will use the sort of system described in U.S. Pat. No. 6,522,580 and the other applications related to NAND systems that are incorporated by reference above. When specific voltages are needed in the following, the erase voltage $V_{erase}$ is taken to be in the 15-20 volt range, the low logic level is taken as ground, and the high logic level $V_{dd}$ taken in the 1.5-3 volt range, although other values can be used, depending on design.

Figure 1:
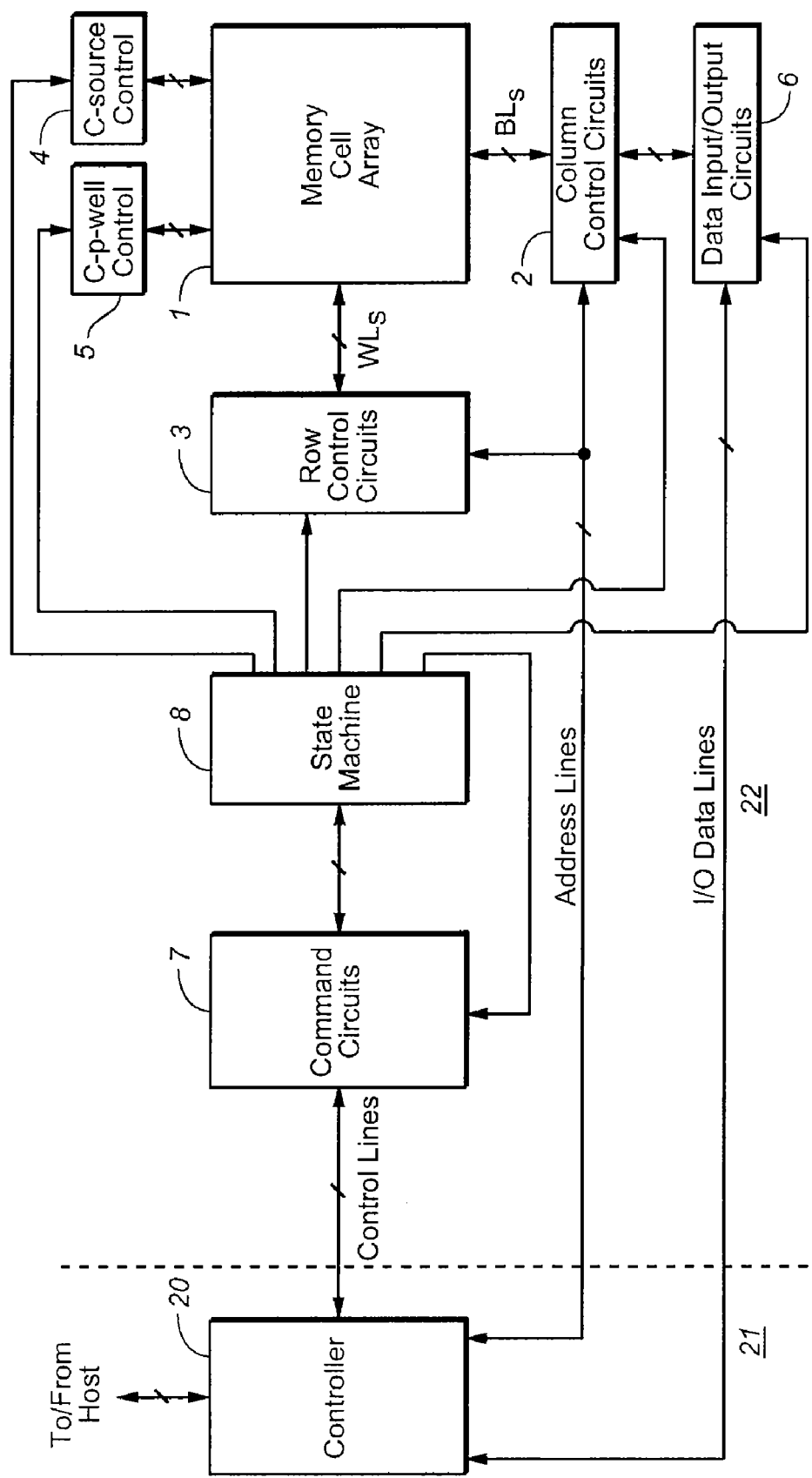
FIG. 1 shows a flash memory system including an array of memory cells and peripheral circuits.

FIG. 1 is a block diagram of a flash memory system. Memory cell array 1 including a plurality of storage units M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of p-type regions (labeled as "c-p-well" 11 in FIG. 3) on which the memory cells (M) are formed. The c-source control circuit 4 controls the common source lines (labeled as "c-source" in FIG. 2) connected to the memory cells (M). The c-p-well control circuit 5 controls the voltage of the c-p-well.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20. Command data for controlling the flash memory device are input to a command interface connected to external control lines, which are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. The host initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. The controller may also perform ECC functions using ECC circuits or firmware configured for ECC operations. Alternatively, ECC functions may be carried out by dedicated ECC circuits elsewhere. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

Figure 2:
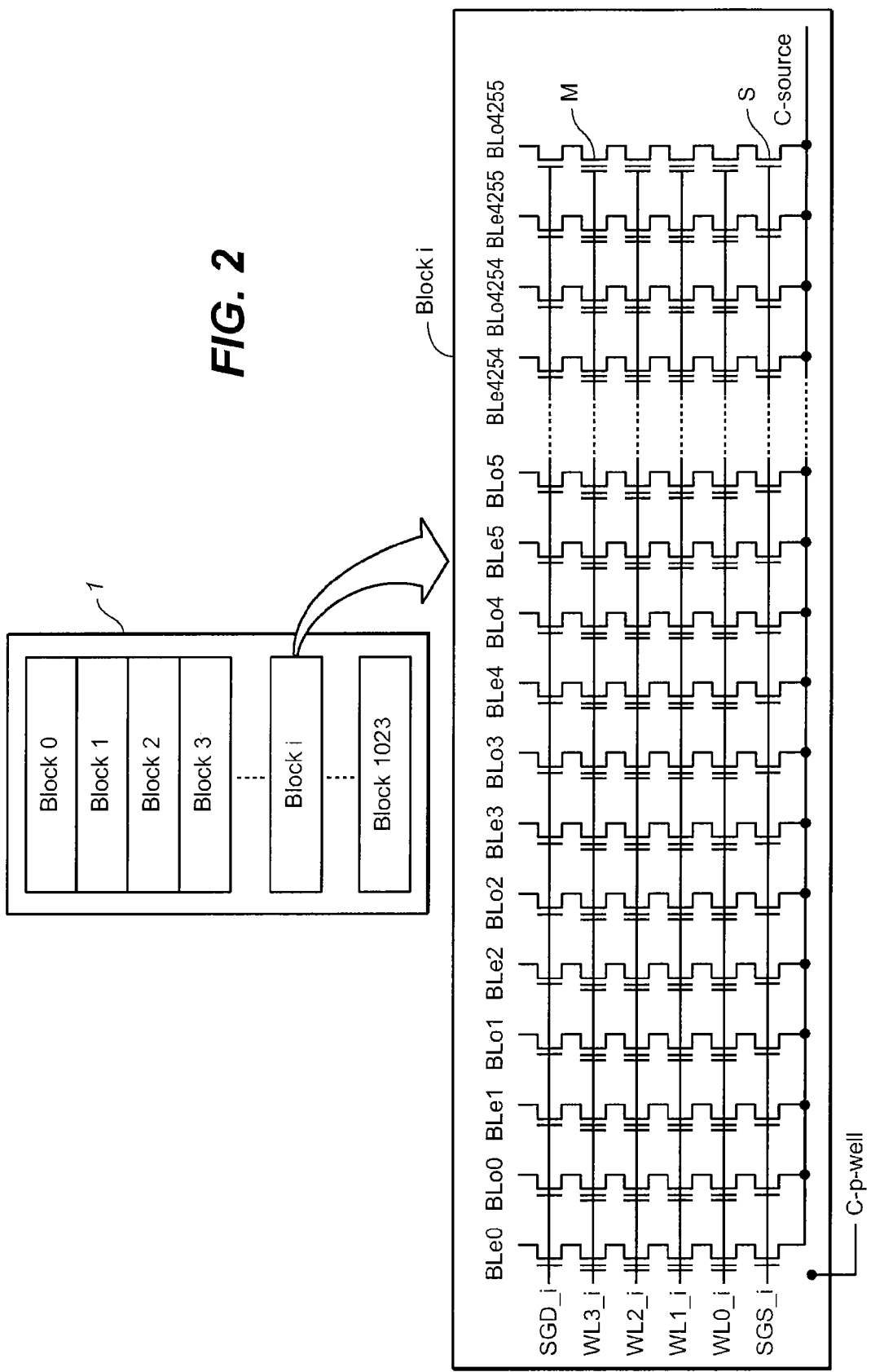
FIG. 2 shows a more detailed view of the structure of the array of memory cells of FIG. 1.

With reference to FIG. 2, an example structure of the memory cell array 1 is described. A flash EEPROM of a NAND type is described as an example. The memory cells (M) are partitioned into a number of blocks, 1,024 in a specific example. The data stored in a particular block are simultaneously erased. The block is thus the minimum unit of a number of cells that are simultaneously erasable. In each block, there are N columns, N=8,512 in this example, that are divided into left columns and right columns, as described in further U.S. Pat. No. 6,522,580. The bit lines are also divided into left bit lines (BLL) and right bit lines (BLR). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first (Drain) select gate line (SGD), and another terminal is connected to the c-source via a second (Source) select transistor (S) which gate electrode is coupled to a second select gate line (SGS). Although four floating gate transistors are shown to be included in each cell unit, for simplicity, other numbers of transistors, such as 8, 16, 32 or even 64 or more, are used. In some memory systems more than 8,512 columns (bit lines) may be provided, for example 67840 columns. FIG. 2 also includes a connection, C-p-well, for supplying the well voltage.

In each block, in this example, 8,512 columns are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although, for simplicity, four floating gate transistors are shown to be included in each cell unit, a higher number of transistors, such as 8, 16 or even 32, are used.

In an alternate set of embodiments, as described in U.S. Pat. No. 6,771,536, which is hereby incorporated by reference, the array can be divided into left and right portions instead of the odd-even arrangement. The left and right sides may additionally have independent well structures with the right and left sides of the array each formed over such separate well structures, allowing the voltage levels to be set independently by the c-p-well control circuit 5 of FIG. 1. In a further variation, this could also allow erasure of a sub-block of less than all of the partitions of a block. Further variations that are compatible with the present invention are also described in U.S. Pat. No. 6,771,536.

In the exemplary embodiments, the page size is 512 bytes, which is smaller than the cell numbers on the same word line. This page size is based on user preference and convention. Allowing the word line size to correspond to more than one page's worth of cells saves the X-decoder (row control circuit 3) space since different pages worth of data can share the decoders. During a user data read and programming operation, N=4,256 cells (M) are simultaneously selected in this example. The cells (M) selected have the same word line (WL), for example WL2, and the same kind of bit line (BL). Therefore, 532 bytes of data can be read or programmed simultaneously. This 532B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

Figure 3:
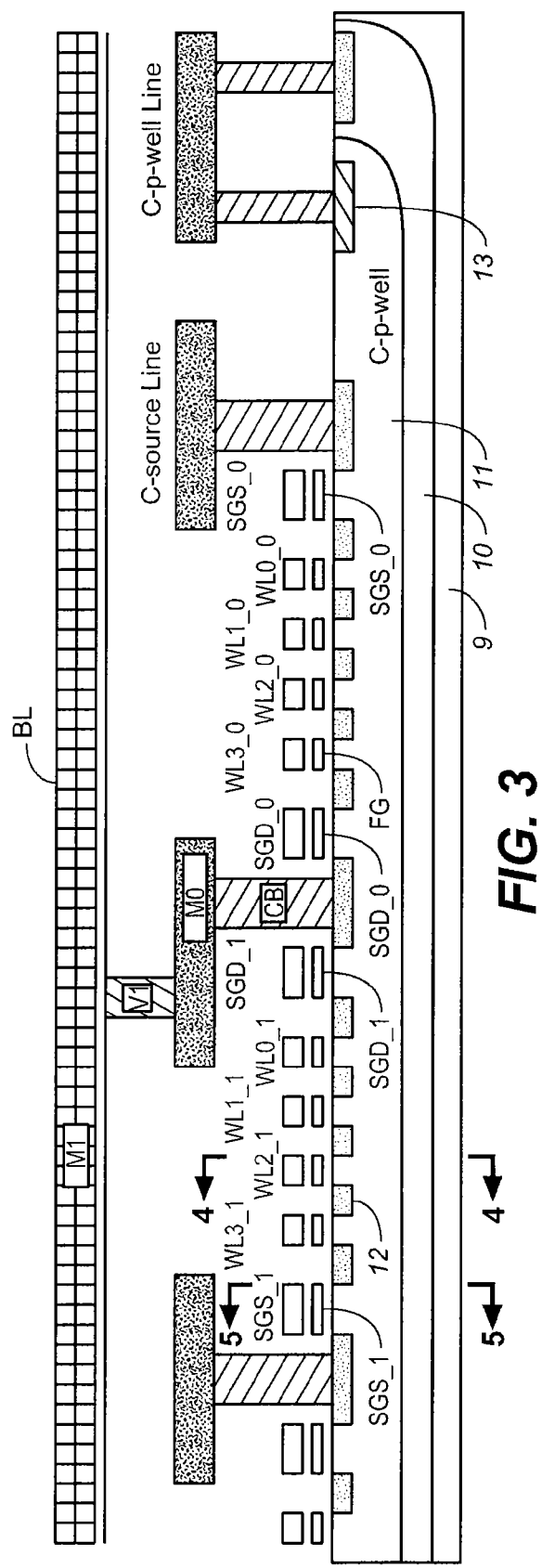
FIG. 3 shows a cross sectional view of a portion of array along the bit line direction.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, each of the left and right c-p-wells being enclosed by an n-type region 10 to electrically isolate the c-p-wells from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

The exemplary embodiment uses Flash EEPROM storage units, where each memory cell has a floating gate (FG) that stores an amount of electric charge corresponding to the data being stored in the cell, the word line (WL) forming the gate electrode, and drain and source electrodes made of the p-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (MO) via the second select transistor (S) and the first contact hole (CB). The common source line is connected to the c-source control circuit (4). The drain electrode is connected to the bit line (BL) made of a second metal (MI) via the first select transistor (S), the first contact hole (CB), an intermediate wiring of the first metal (M0) and a second contact hole (V1). The bit line is connected to the column control circuit (2).

Figure 4:
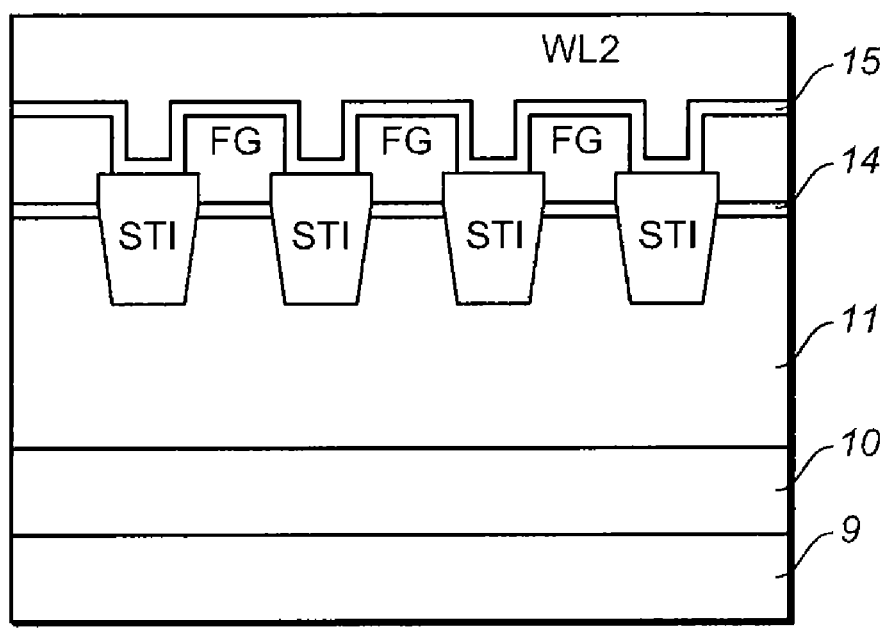
FIG. 4 shows a first cross sectional view of a portion of the array along the word line direction, including a word line and floating gates.
Figure 5:
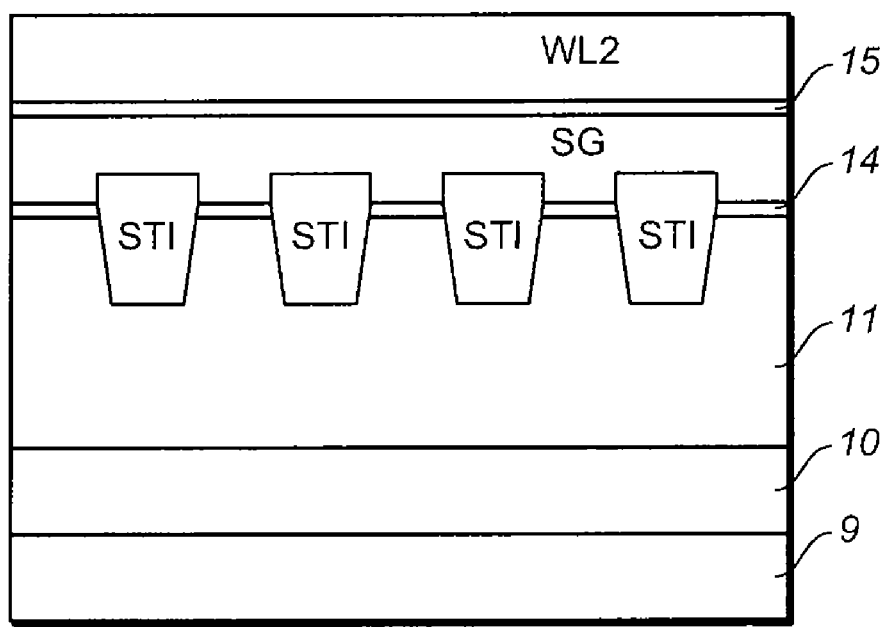
FIG. 5 shows a second cross sectional view of a portion of the array along the word line direction, including a select gate line.

FIGS. 4 and 5 show cross sectional views of a memory cell (section 4-4 of FIG. 3) and a select transistor (section 5-5 of FIG. 3), respectively, in the direction of the word line (WL2). Each column is isolated from the neighbor columns by a trench formed in the substrate and filled with isolation material, known as a shallow trench isolation (STI). The floating gates (FG) are isolated from each other by the STI and insulator film 15 and word line (WL). Since the gate electrode (SG) of the select transistor (S) is formed in the same formation process steps as the floating gate (FG) and word line (WL), it shows a stacked gate structure. These two select gate lines (SG) are shunted at the end of lines.

U.S. Pat. No. 6,522,580, that is incorporated by reference above describes the various voltages applied to operate the memory cell array 1, in a specific example, each memory cell's floating gate storing two bits, having one of the states "11", "10", "01", "00". This is reviewed briefly here for the case where the word line "WL2" and the bit lines of "BLe" are selected for erase, reading or programming. By raising the c-p-well to an erase voltage of Verase=15-20V and grounding the word lines (WL) of a selected block, the data of the selected block is erased. Since all of the word lines (WL) of the unselected blocks, bit lines (BL), select lines (SG) and c-source are put in a floating state, these are also raised to almost Verase due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

The high voltage values used in the erase and programming values can be generated from the lower supply values using a charge pump (not shown in FIG. 1). These higher voltage values can either be produced on the memory chip 22 itself, or supplied form another chip in the memory system. The use and location of the high voltage source is discussed more fully in U.S. Pat. No. 6,282,130, which is hereby incorporated by reference, and additional references cited therein.

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to Vdd of a power supply, for example 3V, as well as the unselected bit lines BLo. The unselected word lines WL0, WL1 and WL3 are connected to 10V, the first select gate (SGD) is connected to Vdd, and the second select gate (SGS) is grounded. As a result, a channel potential of the memory cell (M) that is being programmed is set at 0V. The channel potential in the program inhibition is raised to around 6V because of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In the read and verify operations, the select gates (SGD and SGS) and the unselected word lines (WL0, WL1 and WL3) are raised to a read pass voltage of 4.5V to make these as pass gates. The selected word line (WL2) is connected to a voltage level specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY 01 operation, the selected word line WL2 is connected to 2.4V, so that it is verified that whether the threshold voltage has reached 2.4V. In this verify case, it can be said that a verify level is 2.4V. Again, for all of the described processes, the recited voltage levels are only exemplary values.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, If the threshold voltage is lower than the read or verify level, the potential level of the concerned bit line (BLe) decreases to a low level, for example less than 0.5V, because of the conductive memory cell (M). Further details of the read and verify operations are explained below.

In some memory systems two or more erase blocks are operated in parallel as a metablock. Such erase blocks are erased together in parallel and pages from different blocks (one page from each block) are programmed in parallel as a metapage. In such systems, the metablock may be considered as the unit of erase because individual erase blocks are not separately erased without erasing other erase blocks of the metablock. Also, the metapage may be considered as the unit of programming because a page of an erase block is generally programmed with other pages within the metapage. Examples of the use of metablocks are provided in U.S. Pat.

No. 7,173,852. In some cases, the number of erase blocks in a metablock may be individually selected to form an adaptive metablock as described in US Published Patent Application No. 20050144367.

A write abort or erase abort occurs when power is lost during a write or erase operation, potentially causing cells to be partially programmed. Such power loss may occur for various reasons. For removable memory systems, such as memory cards and USB flash drives, power loss may occur because the memory system is removed from a host before an operation has been completed. When the memory system powers up again, it is desirable to identify any memory portion that may be partially programmed or partially erased so that steps can be taken to recover the data, and to avoid programming further data in a manner that might cause it to be corrupted by storing it in partially programmed or partially erased cells.

Figure 6A:
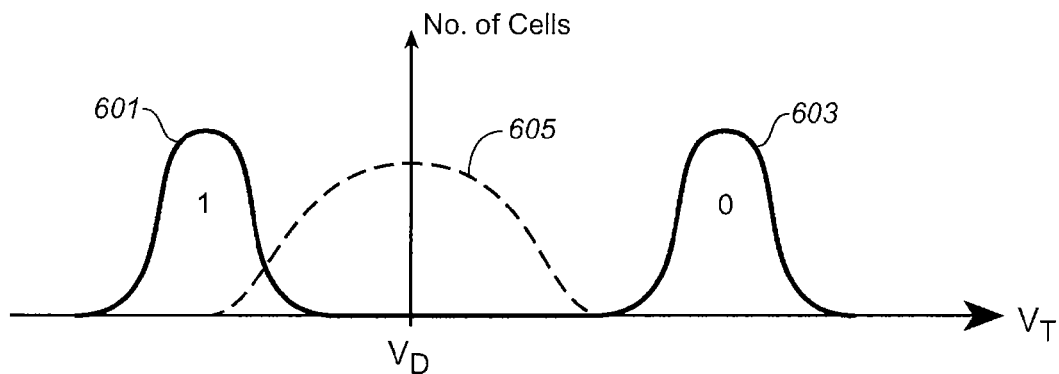
FIG. 6A shows distributions of memory cells in the array including a distribution resulting from a write or erase abort.

FIG. 6A shows how memory cells may be programmed to different memory states by changing their threshold voltages. In particular, a first distribution 601 corresponds to memory cells that store a 1, while a second distribution 603 corresponds to memory cells that store a 0. This type of memory, storing one bit per cell may be considered as a Single Level Cell (SLC) or binary memory. In one example, the logic 1 state is the erased state of the cell, so all cells are erased to the logic 1 state. Then, during programming (or writing), those cells that are to store a 0 are programmed by adding charge to their floating gates to raise their threshold voltages as shown by distribution 603. If an erase abort occurs during erase, or a write abort occurs during writing, cells may be left with threshold voltages that are between distributions 601 and 603, as indicated by distribution 605. The data in these cells is read by considering cells with a threshold voltage above $V_D$ as containing a 0, and those below $V_D$ as containing a 1. When the cells have threshold voltages indicated by distribution 605, a large number of errors occur. Such large numbers of errors are generally detected, and in some cases corrected, by ECC.

Figure 6B:
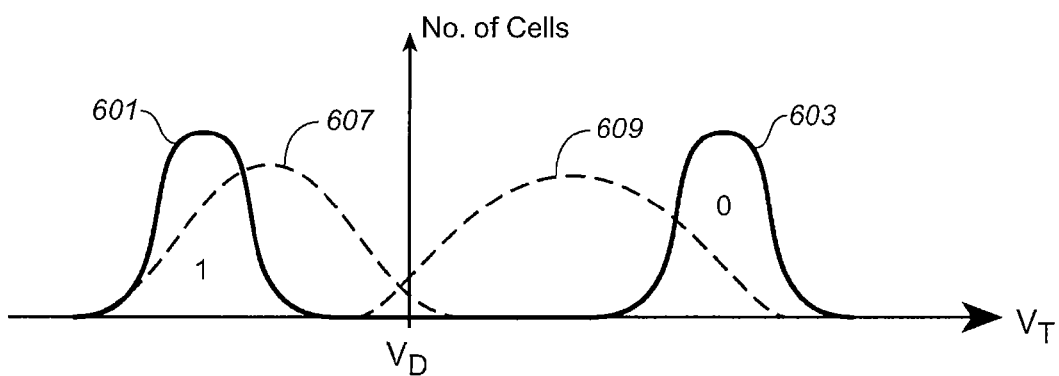
FIG. 6B shows distributions of memory cells in the array including two other distributions resulting from write or erase abort.

In some cases, ECC is unable to detect or correct the effects of a write or erase abort, but the effects may still be significant. Methods of detecting such data are described in U.S. Patent Application Publication No. 2005/0144362. FIG. 6B shows distributions 607 and 609 that may result from partial programming or partial erasing of data. Distribution 607 is shifted from distribution 601, but the distribution remains mostly below $V_D$ so that the cells are mostly read as containing a 1. Because most cells are read as containing a 1, the block appears to be an erased block. The number of cells read as containing a 0 may be a small enough number to be correctable by ECC. Similarly, distribution 609 shows cells mostly having a threshold voltage above $V_D$ so that they are read as containing a 0. Because most cells being programmed to the 0 state are read as containing a 0, such a distribution will generally be ECC correctable. However, in both of these cases, the data, even though correctable by ECC is not stored in the desired manner (as indicated by distributions 601, 603) and this may have serious consequences. For example, such data may be more easily corrupted (i.e. bits changed from 0 to 1 or 0 to 1). This may occur as a result of memory operations on the same, or neighboring cells, or because of environmental factors such as temperature, or for other reasons. Therefore, it is generally desirable to avoid relying on such partially programmed or partially erased data. Distributions, such as distributions 607, 609, may result from either a write abort or an erase abort and the same, or similar, techniques may be used for dealing with partially programmed and partially erased cells.

An exemplary method of avoiding such data is to simply assume, when powering up, that the last block that was programmed before powering down was only partially programmed, regardless of the result of any error detection by ECC. This block may then be subject to protective measures to ensure that the data in the block is not further compromised and that no new data is compromised when it is programmed into the block. Various protective measures are described below. One method is to copy the data from the last programmed block to a new block, where it is rewritten. Thus, data having distributions like 607 and 609 in cells of the old block are rewritten to have distributions like 601 and 603 in the new block. The old block is then erased. Any bits that are indicated by ECC to be in error may be corrected in the copied block. Similarly, partially erased blocks may simply be erased again, without copying of data. The last erased block may be assumed to be partially erased during initialization, so it is erased again. The last programmed block may be identified in a number of ways. Generally, data management structures contain indications of which block was last programmed. In some cases, it may be necessary to copy more than one block of data where it is not certain which block was last programmed. This method is simple and does not require analyzing stored data to try to determine whether it is partially programmed.

Figure 7:
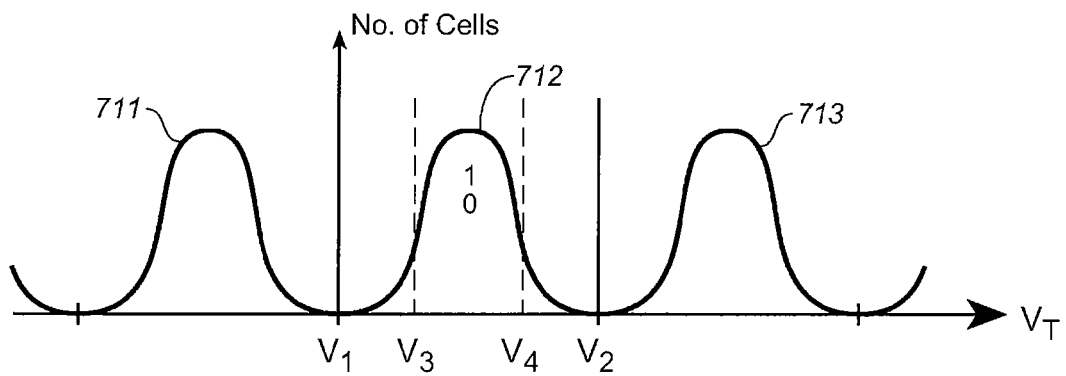
FIG. 7 shows different discrimination voltages used to read memory states with different degrees of sensitivity.

An exemplary method of detecting partially programmed data in memory cells is to use read parameters to perform a read with a higher than normal sensitivity. For example, FIG. 7 shows distributions 711-713 of cells in a Multi Level Cell (MLC) memory system, in which cells are programmed to more than two memory states to store more than one bit of data per cell. Such MLC memory systems are particularly sensitive to corruption of data because of the smaller threshold voltage range assigned to each memory state and smaller margins between neighboring states. In this example, a memory cell stores two bits of data and distribution 712 corresponds to cells storing "1,0." FIG. 7 shows voltages V1 and V2, which are used as discrimination voltages to read memory cells. In a normal read, any cell having a threshold voltage between V1 and V2 is considered to store "1,0." However, as discussed above, partial programming may mean that such cells have distributions that are not ideal and that provide a higher risk of data corruption. In the present example, certain cells are read using different read parameters as indicated by discrimination voltages V3 and V4. Reading the data using V3 and V4 provides a high sensitivity read (higher than the normal read using V1 and V2) so that any deviation from the ideal distribution may be detected. For example, only data that is ECC correctable when read using discrimination voltages V3 and V4 may be considered acceptable, thus requiring a distribution that is reasonably centered and narrow. In another example a read is performed with a first resolution using V1 and V2. Then a second read is performed with a second resolution using V3 and V4 and the results of the two reads provide an indication of whether the distribution is acceptable. For example, an ideal distribution may have 90% of cells between V3 and V4, if only 70% of cells are between V3 and V4, then this indicates a likelihood that the data is partially programmed and some remedial action may be needed (e.g. data may be copied to a new location as discussed above). A high sensitivity read may require additional time, so it is not desirable to do this every time data is read. Instead, a high sensitivity read may be performed only when there is some indication that data is partially programmed. For example, during initialization (upon power up after a period without power) recently programmed data may be read with high sensitivity to identify any partially programmed data.

ECC is used to both detect and correct data stored in non-volatile memory systems. In general, ECC can detect a larger number of errors than it can correct. In some cases, where ECC detects a number of errors that is small enough to correct, but large enough to be significant, such data is considered unacceptable because it has a high risk of becoming uncorrectable. For example, where ECC can reliably correct up to five bits per sector, more than three error bits may be considered unacceptable and may trigger a copy operation or other remedy. Frequently, distributions that are shifted due to partial programming or partial erase, cause a higher than normal number of ECC errors. While such errors may be correctable by ECC, it is desirable identify data that is likely to be partially programmed and to take action to prevent problems arising from such data. One way to identify likely partially programmed data is by the number of ECC errors. When there is some likelihood that data may be partially programmed (e.g. during power up), ECC detection may be used to further determine if there are a significant number of errors. In this case, the number of errors that is considered significant may be lower than normally used. For example, if more than three error bits per sector are normally considered unacceptable, during an initialization routine (or based on some indicator of likely partial programming), data with more than one error bit per sector may be considered unacceptable. Some remedial action may then be taken to protect the stored data and any further data.

Figure 8:
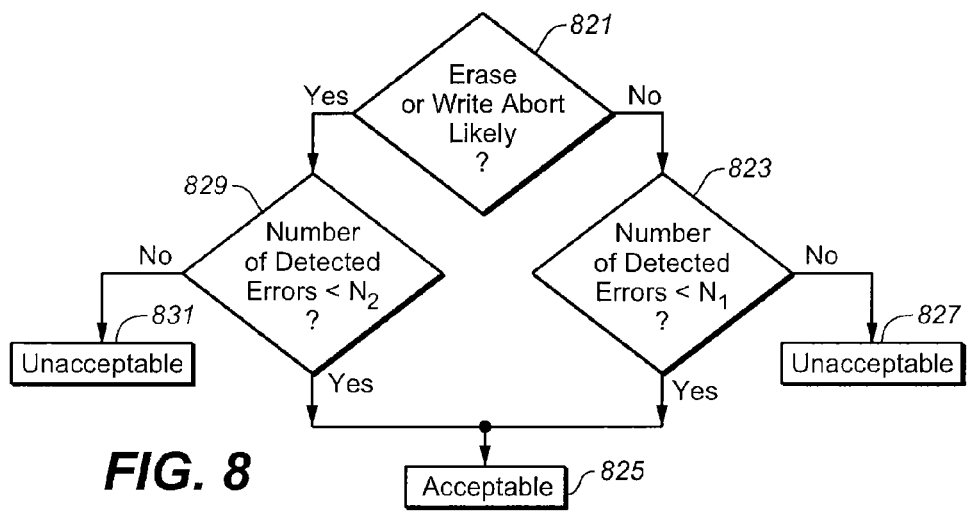
FIG. 8 is a flowchart for a method of identifying a portion of the array that may contain partially programmed data by setting a higher ECC requirement than usual when partially programmed data is likely, e.g. during initialization.

FIG. 8 shows a flowchart including a first determination 821 whether it is likely that a write abort occurred during writing to a particular portion of a memory array (e.g. to a sector or block). It may be assumed during initialization that all blocks, or all recently written blocks are likely to have experienced a write abort. Normally, where no likelihood of a write abort is indicated, the number of error bits detected by ECC is compared with a first number N1, (step 823). If the number of errors is less than N1, then the data is considered acceptable (step 825). If the number of errors is greater than N1, then the data is considered unacceptable (step 827) and remedial action may be taken. During initialization, or under other conditions indicating a likelihood of partial programming, the number of ECC detected errors is compared (step 829) to a second number N2 that is less than N1. If the data contains fewer errors than N2, then the data is considered acceptable (step 825). If the data contains more errors than N2, then the data is considered unacceptable and remedial action may be taken. Thus, the threshold for finding data unacceptable is lower during initialization than during normal operation after initialization.

Figure 9:
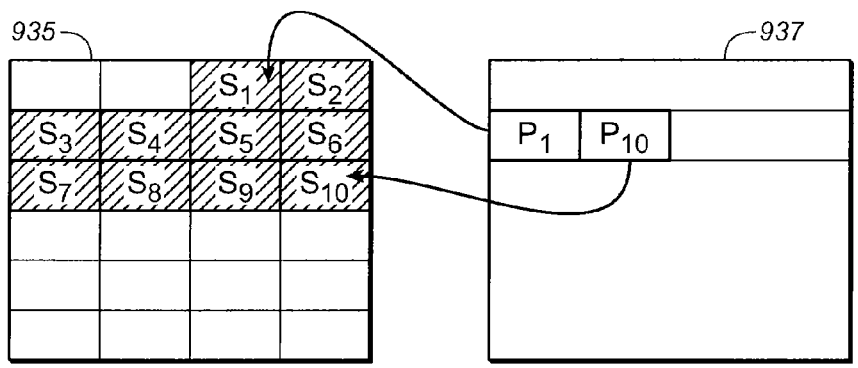
FIG. 9 shows data written with pointers to the locations of first and last sectors in the data indicating that the data has completed writing.

In another method, pointers are used to identify data at the start and end of a command, so that if the command is not fully executed, this can be seen from the difference between the pointer and the last written data. For example, where a group of sectors are to be written to a block, prior to writing the sectors, pointers may be stored indicating the location of the first sector and the location of the last sector. Later, it is possible to verify that the location indicated by the pointer for the last sector was actually written. FIG. 9 shows an example where a group of sectors S1-S10 are programmed to block 935. Sectors S1-S10 may be programmed as part of a copy operation, copying data from elsewhere in the memory array. Prior to programming sectors S1-S10 to block 935, a first pointer P1 is saved that indicates the location of the first sector S1 and when programming is complete, a second pointer P10 is saved that indicates the location of the last sector S10. Pointer P10 may point directly at sector S10, or to the next available location after the location where sector S10 is stored. Pointers P1 and P10 are saved to another block 937, which may be a dedicated block for storing pointers, or a Scratch Pad Block (SPB), or other suitable block. During initialization, the memory controller may look at block 937 to determine what commands were last executed and to see if they were completed. When P1 and P10 are found, the controller verifies from these pointers that data was stored between the locations indicated. For example, if a write abort occurred during programming, the second pointer P10 would not be present in block 937. The presence of pointer P1 without pointer P10 would indicate a write abort had occurred. Thus, the controller would know that a write abort had occurred during copying of sectors S1-S10 and would use the copy of S1-S10 that was being copied. Appropriate action could then be taken. Similarly, pointers may indicate that a block which is apparently erased may have been partially programmed. A pointer that indicates the starting sector of a write command in an apparently erased block may mean that a write abort occurred before cells were sufficiently programmed to change their states. However, any such programming may cause problems later, so identifying such a block is useful in avoiding later problems.

Figure 10A:
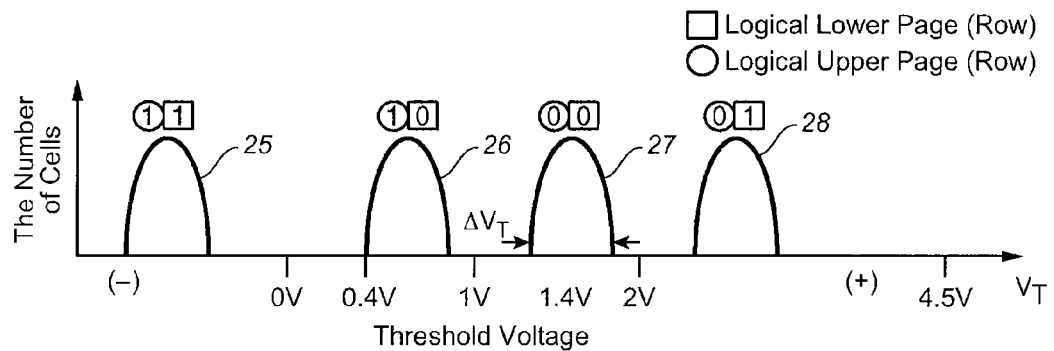
FIG. 10A shows lower and upper programming of cells along a word line.

While rewriting data to another location is one way to deal with data that is partially programmed, or is likely to be partially programmed, other methods of dealing with such data may also be used. In some cases, such data may be left where it is, in particular if the data is ECC correctable. However, in some memory designs, this may present a problem for data that is later programmed into the same cells. In particular, in MLC memory systems, data may be programmed first to a lower page, then later more data is programmed to one or more upper pages. If a lower page is partially programmed, then programming of a higher page into the same (or neighboring) cells may be sufficient to corrupt the data, or leave the data in an unreliable state. FIG. 10A shows an example of how cells along a row may be programmed with logical lower page data first and later programmed with logical upper page data. FIG. 10A shows four threshold voltage ($V_T$) distributions 25-28 that correspond to four memory states so that each cell stores two bits of data. The lower memory states, shown by distributions 25 and 26, correspond to a lower bit value of 1 and 0 respectively. Cells are initially programmed to one of states 25, 26 as part of lower page programming. Later, an upper page is programmed by further programming cells that have a 0 in the upper page to distributions 27 or 28 (depending on lower page bit). Cells having a 1 in the upper page remain in distributions 25, 26. If a write abort occurs during programming of an upper page, for example leaving cells with $V_T$ between distributions 27 and 28, not only the upper page bits are affected, lower page bits are also affected. Further examples of upper and lower page programming are provided in U.S. Pat. No. 6,456,528. In one method, when partial programming is found, or is likely, further programming in that portion of the memory array may be prohibited. This may include prohibiting further programming of the cells containing partially programmed data and also prohibiting programming of adjacent cells. Thus, where a lower page is found to be, or is likely to be partially programmed, one or more associated upper pages may be marked as unusable. The lower page data may be left where it is, but no further programming of the same cells (and in some cases neighboring cells) is performed. In one example, dummy data is programmed into an area of the memory array that is identified as partially programmed so that no additional data is stored and to indicate where a subsequent write is expected. For example, dummy data in one page may indicate that the next write will be to the next page in the memory array. Thus, if there is a write abort during the subsequent write, it can be detected because the dummy data identifies the area that is likely to be partially programmed. Dummy data may be any suitable data pattern.

Figures 10B, 11A, 11B, 12:
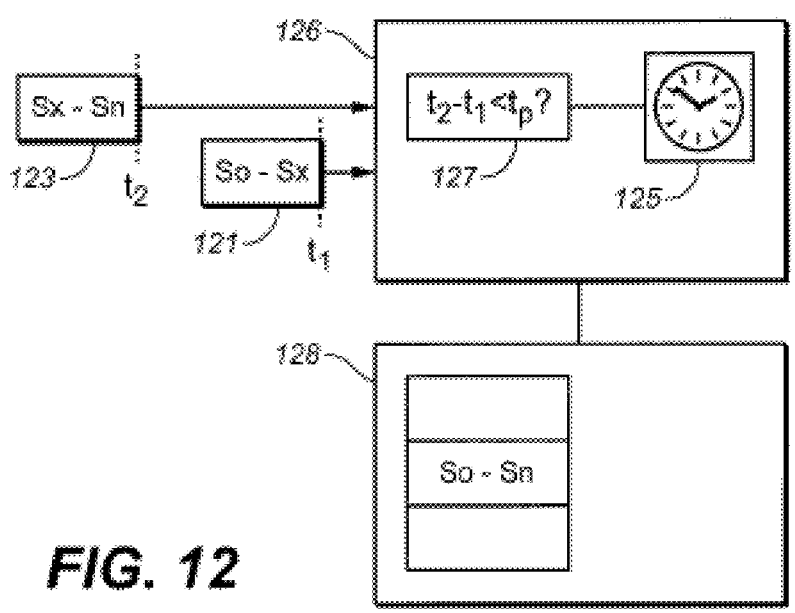
FIG. 10B shows four pages of data stored on a word line of the memory array.
FIG. 11A shows a portion of a block containing sequentially stored data.
FIG. 11B shows a portion of a block containing nonsequentially stored data.
FIG. 12 shows two write commands that are treated as a single command because they are received within a predetermined time, as measured by a timer.

In a common flash memory design, bit lines are divided into odd and even bit lines that are separately controlled so that for a particular word line, even numbered cells are programmed together as a page and odd numbered cells are programmed together as another page. In addition, two or more bits may be programmed to each cell. In one example, first bits are programmed to a group of cells as a lower page and later second bits are programmed as an upper page to the same cells. Thus, the data stored in cells of a word line may be considered to be made up of four different logical pages of data that may be programmed at different times. FIG. 10B shows this four logical page system, with the lower bits of even numbered cells forming a lower even page, lower bits of odd numbered cells forming a lower odd page, upper bits of even numbered cells forming an upper even page and upper bits of odd numbered cells forming an upper odd page. Because lower even and upper even pages are stored in the same cells, if the lower even page is partially programmed, then subsequently programming the upper even page may cause both pages to be corrupted. In addition, programming the upper pages could also cause the lower pages to become corrupted. This is particularly a problem for partially programmed data because of its increased risk of becoming corrupted. In some memory designs, data in cells of adjacent word lines may also affect previously stored, partially programmed data. The risk from subsequent programming depends on the particular memory design. When it is determined that a page is, or may be, partially programmed, the page may be marked (e.g. using dummy data) so that it is not subsequently used to store data, and so that other logical pages that might be at risk are not used. Also, dummy data indicates where the next write is to occur so that a write abort occurring during the next write can be detected. This may be done even if the lower even page appears to be acceptable when ECC detection is used.

Another situation that may arise in MLC memory systems is where a write abort occurs during programming of an upper page. This may cause not only the upper page data, but also any lower page data in the same cells to be corrupted. In addition, data in neighboring cells may also be in the zone of danger, i.e. such data may also be subject to damage if a write abort occurs during programming of the upper page. Therefore, it is desirable to protect lower page data when programming upper page data. Various schemes may be used to protect such data, including creating a backup copy of all lower page data when an upper page is to be written to the same cells. Another example is to check if lower page data is valid or obsolete, and avoid writing upper page data that puts valid lower page data at risk. However, such schemes are inefficient in using memory space and may affect performance.

In general, where data is copied from one portion of the memory array to another as part of an internal memory operation, if a write abort occurs during copy and the write abort is detected, then it is possible to recover the data from the old copy. Thus, in order to efficiently guard against loss of data from write abort during an upper page programming, it may be sufficient to backup only lower page data for which no other copy is present in the memory array.

In some cases, for example where memory management information is stored, sectors of data may be stored nonsequentially (chaotically). That is, sectors are stored in an order that does not reflect the order of their logical addresses. FIG. 11A shows an example of a portion of a block in which sectors are stored in a sequential order. In particular, sectors are stored in the order indicated by their logical addresses X to X+5, i.e. lower even page, lower odd page, middle even page, middle odd page, upper even page, upper odd page (the present example uses one sector per page for simplicity, though memory systems may use two or more sectors per page). FIG. 11B shows an example of a portion of a block in which sectors are stored in a nonsequential (chaotic) order. In particular, sectors are stored in a sequence (X+1, X+5, X+2, X+5, X+1, X+4) that is different to the order of their logical addresses. In such a chaotic block, there may be more than one copy of a sector, i.e. more than one sector with the same logical address such as the two copies of sector X+5 141, 143 shown. One particular danger with programming such blocks is that if a write abort occurs during programming of a particular sector, an earlier copy of the same sector may be affected also, and then there is no usable copy of the sector. For example, if a write abort had occurred during writing of copy 143 of sector X+5, then it could also have affected copy 141 of sector X+5. There may be an unaffected copy of sector X+5, usually in the Original block. However, this does not allow the memory system to return either the new data or the previous data for sector X+5 to the host. In the above example, all sectors except X+5 have a copy available in the memory that is either new, or the previous version. This may be unacceptable to a host application, which expects some data loss if power was lost, but does not expect to lose a sector copy which was successfully programmed before. At the same time, the host is likely to tolerate a loss of previously programmed sectors if they make a logically sequential sequence, as they are likely to be part of the same file. But loss of two copies of X+5 means that the latest good copy is too old, not up to date with the other sectors, which are either the latest copies sent by the host or the immediately previous versions. This mismatch can make it difficult for the host to do recovery, if say, X+5 was a directory or FAT record.

In a method of dealing with such problems, sequential and nonsequential data are treated differently. Nonsequential data is programmed so that a copy of lower page data is made before upper page data is programmed. Thus, in the example of FIG. 11B, a copy of copy 141 of sector X+5 (and in some cases sector X+1) is created elsewhere in the memory array before programming a the middle or upper pages including copy 143 of sector X+5. Thus, if a write abort occurs during programming of copy 143, another copy of sector X+5 exists. Similarly, a copy may be made of the middle pages before upper pages are programmed. In contrast, no such copies are necessary for sequentially programmed blocks because there is no danger that when a write abort occurs during programming a sector, an earlier copy of the same sector is affected. In one example, a memory system may include both sequential and nonsequential blocks. All lower page data may be backed up prior to programming higher page data in a nonsequential block. No such backup may be performed for sequential blocks.

Although the above method prevents loss of two copies of the same sector when a write abort occurs, it may require copying more data than necessary. In an alternative method, instead of copying lower page data for all writes to upper pages of nonsequential blocks, the data to be written is compared to the data in the lower pages to see if the logical addresses match. Thus, prior to programming copy 143 of sector X+5, the lower pages are examined to see if they contain a sector with an address X+5. Because copy 141 of sector X+5 is in the lower odd page, copying of the lower page is performed. This method may be combined with the previous method, i.e. a determination may first be made as to whether the programming is sequential or not and only if it is not sequential is a determination made as to whether a sector with the same logical address is stored in a lower page. It should be noted that although the examples of FIGS. 11A, 11B show only lower page data being affected, other pages may also be considered to be in the zone of danger when later programming is performed and may be backed up also when programming higher pages.

In either of the methods described above for protecting lower page data excessive copying may be avoided by verifying prior to creating a backup copy of lower page data that the data has not already been backed up. For example, when programming copy 147 of sector X+1 into the upper even page, it is found that an earlier copy 145 of sector X+1 is stored in the lower even page. However, because a backup copy of sector X+1 was already created (when storing copy 147 of sector X+5), this sector does not need to be backed up again.

Another method to reduce unnecessary copying of data in a nonvolatile memory is to treat two or more sequential write commands as a single command when the commands are received close together in time. This can reduce copying of vulnerable data and writing of control record update information. FIG. 12 shows a memory system that receives two write commands within a short period of time. A first write command 121 to write sectors S0 to Sx and a second write command 123 to write sectors Sx+1 to Sn. The first command 121 is received and triggers a timer 125 in controller 126 that starts at time t1, at the end of command 121. When the second write command 123 is received at time t2 and is seen to be sequential to the first write command 121 (i.e. sector Sx+1 is sequential to sector Sx), a comparing circuit 127 compares the time difference between the two commands (from the end of first command 121 to the start of second command 123) with a predetermined time tp. Because t2-t1 is less than tp, the two commands 121, 123 are treated as a single command and sectors S0 to Sn are stored together in the memory array 128, and a single control record update is performed for both commands that includes the locations of sectors S0 to Sn. No backing up of sectors S0 to Sx is needed when programming sectors Sx+1 to Sn, because all sectors S0 to Sn are considered as if they were part of a sequential write command, so treating successive commands as a single command in this way reduces the amount of vulnerable data that is copied.

EXEMPLARY IMPLEMENTATIONS

As there is a tradeoff between reliability and performance, three different reliability modes are provided in this implementation so that a suitable mode may be selected according to particular requirements. The reliability modes are called: reliability modes 1, 2 and 3 respectively. The reliability mode may be selected at the factory or later.

Reliability Mode 1: Maximum Reliability
1. Assuming Host Write Cache is disabled, the previous commands' data is always maintained in a safe manner in this mode
2. For write aborts of any single/multi-sector commands when Host Write Cache is disabled—out of the last sequence of sectors sent in the last command, up to X sectors back may be lost and the previous copy will be returned instead.
3. When Host Write Cache is enabled—out of the last sectors sent by the host, which might be spread over a few commands, up to X sectors back may be lost and be replaced with an older copy, not necessarily the previous copy.
X denotes the number of sectors which were not fully programmed, or that were disturbed as the result of the write abort.
Any successfully programmed sectors will retain the newly programmed data.

Reliability Mode 2: Sequential Write Performance Optimization
1. Assuming Host Write Cache is disabled, all data written during commands prior to the last sequence of subsequent commands is guaranteed.
2. Assuming Host Write Cache is disabled, for write aborts of any single/multi-sector subsequent commands—out of the last sequence of sequential sectors, which might be spread over a few commands, up to X sectors back may be lost and the previous copy will be returned instead.
3. When Host Write Cache is enabled—out of the last sectors sent by the host, which might be spread over a few commands, up to X sectors back may be lost and be replaced with an older copy, not necessarily the previous copy.
X denotes the number of sectors which were not fully programmed, or that were disturbed as the result of the write abort.
Any successfully programmed sectors should retain the newly programmed data.
Subsequent commands are defined as sequential writes to consecutive addresses which are separated by short delays incurred by the host/protocol. The maximum delay allowed will be a parameter with a default value of 10 ms.

Reliability Mode 3: Optimized for Sequential and Random Write Performance
1. Minimized performance hit on random and sequential writes.
2. No detection of marginal write aborts in user's data blocks—assuming that these have low probability.
3. In case of a write abort, allow some data loss of previously saved data, in which case old data is returned, not necessarily the previously written.
4. In order to simplify the write abort testability, a special mode used for testability purposes only is implemented. In this test all open sequential update blocks are flagged for consolidation before any new write will be written to them. This guarantees that there are no writes to marginally erased sectors, and that all marginally programmed sectors are relocated with the first few writes to the card. This mode will be controlled through a dedicated bit in a file.

Guarantee Previously Programmed Data (Modes 1 and 2)

In order to guarantee the validity of the data which was programmed in previous commands, each new write command initiates a "Safe Mode" operation. All the data that can be corrupted in the case of a write abort is copied to a special block dedicated for this purpose and will be called the "Safe Zone Block (SZB)". This mode will be initiated only in reliability modes 1 and 2.

Safe Mode operation—Copy pages at risk. The copy operation will begin immediately before the write to the update block. If the host sectors are written only to a Scratch Pad Block (SPB) i.e. the sectors are not ending at, or crossing a physical page boundary, no pages will be copied. Only the pages susceptible to corruption will be copied, i.e. the pages which share the same WL with the page about to be programmed. Therefore, the exact pages to be copied depend on the programmed page and the page sequencing scheme (WL-LM/non-WL-LM). The use of SCP in nonvolatile memory systems is described in U.S. Patent Application Publication Nos. 2006/0161722 and 2006/0155922.

Conventional Page Sequencing (Non-LM)

Conventional page sequencing for cells along a word line that are divided into even and odd pages, and upper and lower pages such as shown in FIG. 10B is the following: lower even, upper even, lower odd, upper odd (it may alternatively be: lower odd, upper odd, lower even, upper even). Thus, the same cells are programmed with lower page data then upper page data and subsequently remaining cells along the word line are programmed with lower page data then upper page data.

- If the command starts at an even lower page, no data will be copied.
- If the command starts at an odd lower page, the corresponding even lower page will be copied.
- If the command starts at an even upper page, both corresponding lower pages will be copied.
- If the command starts at an odd upper page, the corresponding even upper page and both lower pages will be copied.

LM Page Sequencing

LM (Lower-Middle) page sequencing uses the following sequence for programming cells along a word line: lower odd, lower even, upper odd, upper even (or alternatively: lower even, lower odd, upper even, upper odd). Thus, both lower pages are programmed first, then upper pages are programmed. Like in the non-LM sequencing, at the beginning of the command all pages are copied. Since potentially pages from two different word lines (WLs) may be at risk, and the current command might be updating only one of the WLs we don't necessarily have to copy the pages from both the WLs. Therefore, the specific pages to be copied will be determined according to the length of the command—if the command is confined to updating pages in only one WL, only the pages at risk of this particular WL will be copied to the SZB. If the command is long, such that pages in both WLs will be updated, then the pages at risk of both WLs will be copied at the beginning of the command. In case of an open ended command (such as in SD products), pages from both WLs will always be copied. We need to explain what LM means. Do you have the background material for it? FIG. 10 would do.

Notes:

- When copying pages from one particular WL, the pages may not necessarily be consecutive.
- When using WL-LM page addressing, a special consideration is needed when pages have to be copied for either the first or the last 2 WLs in the block, since in these WLs, the page order is different from the one used in the middle of the block, and hence the specific pages to copy will differ as well. This is especially important as the exact pages to copy depend on the command length.

Although it might be slightly more complicated, this can potentially reduce the overhead, as the copied pages will be lost once the SZB will be compacted.

- If a short (less than 2 meta-pages) command starts at the beginning of an even lower page, no data is copied. If a long (more than 2 meta-pages) command starts at the beginning of an even lower page, both lower pages of the previous WL are copied.
- If a short command (less than one meta-page) starts at the beginning of an odd lower page, the corresponding even lower page is copied. If it is a long command, both lower pages of the previous WL, as well as the corresponding even lower page of the current WL are copied.
- If the command starts at an even upper page, both corresponding lower pages of the same WL are copied.
- If the command starts at an odd upper page, the corresponding even upper page and both the corresponding lower pages of the same WL are copied.
- If the command starts at a middle of a meta-page, the distinction between short and long commands will change according to the starting location within the meta-page. Also, if the command starts in the middle of an Even page, the partial meta-page will always be copied to the SZB along with the other pages. (Note: it is not necessary to copy the partial meta-page if the command starts in the middle of an Odd Upper page, as it is not at risk of being corrupted).

The copied pages are stored in the Safe Zone Block (SZB). An index sector is not be programmed, in order to avoid the additional overhead (additional program operation). However, the information of copied pages is tracked in RAM and is written in the next SPBI index update. The copy operation uses the "On-Chip Copy" routine whenever possible and utilizes full parallelism during the copy for better performance (the copied pages are copied and stored in the SZB in fully aligned meta-pages). If Flash Write Cache is used, the host sectors do not start programming until the copy operation is completed successfully (as indicated by a "True Busy" signal). Due to the use of the "On-Chip Copy", the copied sectors will not have a unique sector header in the SZB. When using interleaved memory configuration, the susceptible meta-pages are copied concurrently using full meta-pages copy, even if the command is updating only few of the planes/dies. No optimization per specific dies/planes is made.

The copied pages become invalid once enough host sectors are programmed such that any write abort only affects new data. If not enough host sectors were programmed, then the relevant copied pages will remain valid. In the next subsequent write command to the same update-block, only the necessary additional pages are copied to the SZB. During initialization, the SZB is scanned to locate the copied pages written after the last SPBI. Those pages will be used for the write abort detection.

Safe Zone Block Pre-Emptive Erasure

Before starting to copy the pages, the system verifies that there is enough space in the SZB for the copied pages (according to the number of pages that have to be copied). If there is not enough space, the SZB is erased prior to the copy operation. The copied pages (both valid and invalid) are not retained during SZB compaction. This is done to speed the SZB compaction process. Since the pages are copied anyway (from the old SZB to the new one or from the update blocks to the new SZB) this should not incur any significant performance degradation. Instead, a new block is allocated and the at-risk pages of the current command are copied to it.

Write Abort Detection

Write abort can happen by definition at any moment, and may result in different levels of under-programming. In the general case, the under programmed sectors will result in un-correctable ECC errors which will be detected during initialization. However, on certain cases the sectors can be marginally programmed/erased such that those sectors will be detected as written valid sectors or erased sectors during the initialization. Still, when read at a later time, perhaps due to disturbs, or to slightly different operating conditions (voltage, temp. etc.), those sectors might return uncorrectable ECC errors.

The following features ensure that even those marginal cases are detected. The detection schemes will vary between sequential update block to chaotic update block to control blocks, as each block type follows different update rules.

Note that modes 1-3 may employ different techniques to achieve different levels of protection in the case of write erase: Mode 1—all methods, including safe zone copy for every command, Mode 2—same, but no safe zone copy for sequential command sequences, Mode 3—no safe zone copy, but other protective measures may be used.

Marginally erased sectors are sectors which started the programming process, and the write abort happened so early in the process that the sectors still appear as erased. The issue in this case is that as the sectors are detected as erased, data will be programmed to the same location, and once they are read, an uncorrectable ECC (UECC) error might result.

Reliability Mode 1

In order to detect marginally erased sectors, a pointer is written to a control block (to the SPB) and is used to indicate that a page is about to be written to that location. This pointer indicates that host data is about to be written, and should be expected. Therefore, the write pointer is written immediately prior to writing the host data in the update block, i.e. after the host data ends at, or crosses a page boundary. If host data is about to be written only to the SPB, no write pointer will be written. Upon initialization, if there is such a pointer without another pointer to indicate the completion of the transaction, or without another pointer to another command, a write abort is assumed, even if the pages pointed to by the pointer are detected as erased. The appropriate recovery scheme may then be initiated.

Whenever previously written pages have to be copied to the SZB as part of the "Safe Mode" operation, as described in section 0, those pages will indicate that the page is about to be written and no additional program operation is needed. A write abort will be detected whenever the last entry written in an update block matches an entry written in the SZB. In non-LM page sequencing the last WL written in the update block will be checked. In LM page sequencing the last 2 WLs will be searched.

When no pages are copied as part of the Safe Mode operation a dedicated write pointer to the next available sector in the update block is stored in the SPB.

Reliability Mode 2—Subsequent Sequential Commands

In order to guarantee the highest possible sequential write performance a special consideration is needed. Long sequential sequences are often divided into separate commands, usually of 128 or 256 sectors long. Due to the use of LM-mode memories, ensuring that any data written during previous commands won't be corrupted requires copying the pages susceptible for corruption, resulting in a high performance penalty.

A simple software counter is used to measure the delay between consecutive commands to the same update block (accesses that keep the block sequential may be considered as subsequent). If the delay is smaller than a certain predetermined time tp (design parameter, default tp=10 mS), no copying is done, as the different commands can be considered as parts of the same sequence. From the user experience/host perspective, the last X pages of data may be lost in the case of a write abort.

The write abort detection scheme is similar to those of Reliability mode 1, i.e., if pages were copied as part of the Safe Mode operation, they are used for the write abort detection. Conversely, if no pages were copied to the SZB, and the write command is not subsequent to a previous command, a dedicated pointer is written to the SPB indicating that new host data is about to be written. In case of a write abort the pointer is used for the detection.

Reliability Mode 3

Marginal write aborts are not detected. Safe Mode is not initiated and no pointers are written to the SPB. Write abort is detected if any of the sectors in the first erased page have at least 3 bits which are programmed to '0'. Counting the zero bits will be used to increase the probability of detecting marginal write abort, without paying the extra performance penalty.

Writes to the First Page of an Update Block

The first write to an update block can also be aborted in a way such that the block will be detected as an erased block. However, the programming sequence could have started already, which might result in UECC if the same block will be programmed again. Therefore, in order not to add an extra Scratch Pad Block Index (SPBI) write before every write to an update block, all the erase blocks in the erased block list after initialization are always erased again before being written. The erase command is sent before the first write to the block, to ensure that no partially erased block gets programmed again.

Detecting Marginally Programmed Sectors

Marginally programmed sectors are sectors which experienced write abort before the program was completed, but still the sectors can be read without returning an uncorrectable ECC error. However, since the program operation wasn't completed successfully, the marginally programmed distributions might shift due to disturbs, or different operating conditions, causing subsequent reads to result with un-correctable ECC errors.

Reliability Modes 1, 2

After the last sector of a command is programmed, a timer starts. If another write command is received within a fixed timeout period (default=10 mS), the next command will not require copying previously written sectors from the update blocks, or updating the SPBI in the SPB. Either one of these (copying previously written sectors or updating SPBI) will indicate that the previous write command was completed successfully. In this case, no additional overhead will be added.

Whenever the host becomes idle for more than the fixed timeout, the SPBI is updated to indicate that the all the data was programmed successfully. The extra control write guarantees that all the data is detected as completely written, while limiting the extra overhead to idle times.

Write abort detection will not rely exclusively on scanning the update blocks and looking for ECC errors. Instead, the detection may be based solely, or at least partially, on the copied pages to the Safe Zone Block, the last written pointer in the last written SPBI and the last written sector in the update block.

Reliability Mode 3

Write abort is detected if any of the sectors in the last 2 programmed WLs have at least 3 error bits as determined by ECC. The use of a lower ECC threshold is used to increase the probability of detecting marginal write abort, without paying the extra performance penalty.

Write Abort Detection During Pre-Padding/Sequential Block Closure:

Both sequential block closure and pre-padding of sectors involve copying of sectors into an already open update block. Therefore, these cases are detected and handled in the same way as if the write abort occurred during a host write.

In reliability mode 1, and in reliability mode 2 if the command is not subsequent to a previous command, previously written sectors in the same block are copied to the SPB as described in section 0. If there is no need to copy any sectors to the SZB, a pointer to the first sector which is about to written (the first unwritten sector in the update block) is written to the SPB. In reliability mode 2, if the command is subsequent to a previous command in the same logical group, neither previously written sectors nor pointer are written to the SPB.

In order to simplify the initialization, the SPBI is updated with every sequential block closure. This guarantees that the data in all the closed blocks is valid and can be trusted.

Write Abort During Updates of Chaotic Update Blocks:

Any data written to a chaotic update block are programmed to the lower pages only. The upper pages are skipped by incrementing the write pointer to the next lower page. The SPBI has no valid data mapped to upper pages.

Since chaotic update blocks are initially allocated as sequential and only once the host writes non-sequentially they are turned into chaotic. Therefore, while the block is sequential, both lower and upper pages will be used. Once the block turns chaotic, a pointer to the first chaotic page in the block is logged in the SPBI. In addition to minimizing data loss in case of write abort, the use of the lower pages will significantly decrease the size of the SPBI/CBI structure. This enables storing all the additional pointers and control information of the pages stored in the SPB, while still keeping the length of the SPBI/CBI at a single sector.

Reliability Modes 1, 2

Similarly to the case of sequential update blocks, when the write begins at an even page, no data is copied to the SPB, but a SPBI index is written, indicating that the page is about to be written. When the write begins at an odd page, the even page of the same WL is copied to the SPB, and is used to indicate that a write is about to take place, without any need for an additional write pointer. In reliability mode 2, copying of the previously written pages or writing the pointer to the SZB is done only if the command was not subsequent to a previous command within the same block (even in chaotic block).

It is assumed that the probability of corrupting the Even Lower page when a write abort happens during the programming of the Odd Lower page is low. Therefore, during writes to the lower pages of a chaotic update block no copy is performed. Instead, before the first write after initialization to each of the chaotic update blocks the first erased page will be programmed with a "DUMMY" pattern, and the next erased page will be programmed with the data.

Reliability Mode 3

Before the first write after initialization to each of the chaotic update blocks, the first erased page is programmed with a "DUMMY" pattern, and the next erased page is programmed with the data.

Write Abort Detection During Compaction/Consolidation

As both operations require writing to a newly allocated block, a pointer is written to the SPB before starting the garbage collection. The SPBI includes an atomic command index field, indicating which update block is about to begin either compaction or consolidation. A write abort is detected according to the pointer in the SPB. The new block is found through scanning of the blocks in the File Block List (FBL), and is simply erased.

As this adds relatively low overhead while simplifying the initialization sequence, it is implemented for all reliability modes.

Write Abort During Updates of Control Blocks Boot/GAT/ MAP Blocks

The memory management system includes several blocks which hold critical information: Boot block, MAP block (bitmap of erase condition of blocks), and the Group Address Table (GAT) block (see U.S. Patent Application Publication No. 2007/0113029). In order to guarantee that any critical data is not corrupted due to write aborts, any update to these blocks uses Lower Even pages only. While doing compaction of the control block, the odd pages are used, as the data is still programmed to the full control block and can be recovered in the case of a WA. This is especially important for the GAT block, as it allows utilizing the block's space more efficiently and reduces the frequency of the control block compactions. The control blocks use both lower pages (Even+Odd), as the probability of such corruption is assumed to be low.

In all reliability modes 1-3, the control blocks updates are preceded with a pointer update in the Scratchpad block indicating that the control block is about to be written. The pointer may be combined with that of the previous command—in such case no additional pointer is needed. Instead of updating the SPBI before every control write, the first control update after initialization in each of the control blocks programs the first available page with a ."DUMMY" pattern, and the next available page is programmed with the control information. The control block update is always followed by a data write (which triggered the update) so there is no need to write a pointer after the control update.

Scratch Pad Block

The scratchpad block is updated much more frequently than the other control blocks, therefore both even and odd lower pages are used. This utilizes the space in the SPB more efficiently and reduces the number of SPB compactions (and thereby the number of MAP block updates) significantly. This is important, especially after using the SPB for storing susceptible host pages.

If the lower even page is disturbed by programming the adjacent odd page, the correct indexing information is recovered during initialization using the most updated valid entry in the SPB and scanning of the update blocks. Therefore, after programming the copied pages from the update blocks, or after programming only the SPBI sector, the next available lower page is used—either even or odd. If partial page data is written to the SPB, the next available even lower page is used, as this data cannot be recovered if corrupted. The SPB will use both lower pages (Even and Odd), even after partial page write, as the probability of such corruption is assumed to be low.

In addition to storing pointers to the next available sector in each update block, the SPBI also stores pointers to the next available sector in the GAT, MAP and Boot blocks. The pointers point to the next available lower page (either the next even page or odd page, according to the data stored in the last page in the SPB), skipping the upper pages and the lower odd (if needed) pages. The SPBI includes an atomic command index field, indicating if any write command is causing a FBL (Free Block List) fill (an operation to populate the Free Block List in SRAM, to get blocks to do next writes), or whether one of the control blocks is being updated or compacted. Since the SPBI is updated before starting to write to a newly allocated block, the atomic command index indicates any control block update—no additional SPBI update is needed.

During initialization, whenever the atomic command index field indicates that the following command is causing FBL fill, or when the pointers don't match the first unwritten sector in one of the update blocks/control blocks, a write abort condition is detected.

Safe Zone Block

The Safe Zone block uses both lower pages (Even+Odd). This allows the full utilization of the space in the Safe Zone Block, since even if the data in the adjacent page is corrupted (due to a WA), the data is still valid in the update block from which we copied the data. Therefore no data will be lost.

Initialization

The following initialization procedure relates to particular memory system architectures that use data management methods described for example in U.S. Pat. No. 7,139,864. Open update blocks/FBL/CBL (Cleared Block List—list of recently erased blocks which are not recorded in flash data structures yet, e.g. not in EBL or MAP) lists recovery 1. Find 1st Boot Block
2. Find 2nd copy of Boot Block
3. Find and Verify the latest Boot Sector
4. Find MAP Block
5. Find valid EBM sector (Erased block Management sector, the sector which contains EBL or Erased block list).
6. Initialize FBL
7. Find the last Scratch Pad Page in SPB. Load SPBI Sector to SRAM.

Once the SPBI sector is loaded to SRAM, the block management tables will be reconstructed in RAM, including any information that was written in the SPBI after the last SPBI was written (if there are Safe Mode pages). Since the SPBI will not be updated before any new block allocation, we still have to search the blocks in the FBL list. The update blocks will be detected and the last written sector in each one will be found. Then the blocks will be scanned to determine whether a write abort occurred.

Normal Write Abort Detection

A meta-block is deemed to have experienced write abort if the following conditions are met:
    the block is in FBL;
    the block is detected as not erased;
    at least one sector within the last non-erased meta-page (and also within the lower pages of the same physical word line if the last non-erased meta-page is Upper MLC page) has more than 2 ECC Errors; In case of WL-LM, the pages in the 2 last written WLs will be checked.

The method to detect such meta-blocks consists of the following steps:
1. All meta-blocks in FBL are binary searched. The search finds the last written sector in the meta-block. As the binary search may have missed some written sectors in the area thought to be erased, or some corrupted data in the area though to be properly written, additional checks are required.
2. All sectors from the first sector of the metapage, where the detected last written sector is, to the sector itself inclusive are written and have no more than 2 bits of ECC. If the metapage of the last written sector is upper MLC page, then check that all the sectors in the lower meta-pages of the same word line are written and have no more than 2 bits of ECC;
3. If WL-LM is used, and the last written page is a lower page, the corresponding upper and lower pages of the previous WL will be read and the ECC activity will be monitored.
4. All sectors in the metapage after the sector are erased. If this is the last sector in the metapage (and the metapage is not the last one in the block), then check that the next metapage is erased and has no more than 2 zero bits. This check conforms that the binary search has not missed any written sectors.

Marginal Write Abort Detection

Even if all the tests indicate that all the data is valid, there could still be a marginal write abort. The system will compare the Safe Mode entries in the SZB to see if any of those matches the last written sector in the update block. If there is a match, then the system intended to write a sector to the update block which might have corrupted the previously last written sector. This is detected as marginal write abort case, and the appropriate recovery is initiated.

If the last written block in the FBL is closed (written fully), it's original block is erased and the next block in the FBL is erased, the system will erase the next block again to ensure that no marginal WA on the new block occurred.

Write Abort Handling

The write abort detection is done during the initialization. The handling may be deferred until the first write command which doesn't require a Garbage Collection (GC) operation, in order to meet the initialization timeout.

The ECC correctable data (i.e. any sector which can be read without UECC) written in the block which experienced the write abort is copied to a new erased block, which becomes a new Update block for the Logical Group. All the valid data in the block is copied, including the valid data written as part of the last command (that potentially experienced the write abort). Data of the last command is copied until the first sector that fails for UECC. For the next sectors, the previously written data is returned.

All the valid data up to the last written WL (or 2 WLs in case of LM), is copied to the new block. If data written in the last WL (or 2) is experiencing UECC, the relevant pages are copied from the Safe Mode pages stored in the SPB. Resolving which one of the copies is the valid one (either in the Safe Zone Block, or in the update block) will be done during the consolidation or during a read command of the at risk sectors. This will be done to shorten the initialization.

If no Safe Mode pages exist (Reliability Mode 3), and the last WL (or 2) is experiencing UECC errors, the data in meta-pages which experience the UECC are discarded, starting with the first sector which experiences UECC. From that sector all the data is discarded in order not to mix old and new data. The recovered data can be obtained according to one of the following options:

The data may be copied as is (whatever was read)

The previous sector copy, still stored in the Original block or possibly in the same block, if the block is Chaotic, may be used as valid, up to date, data for those sectors.

A fixed pattern may be written

The specific recovery method will be selected according to the product. The block which experienced write abort may be erased and added back to the erase pool.

Write Pointers

Start Sector Marking—by Write Pointer

The method of marking of a Start sector by recording a write pointer is generally sufficient to get all useful information about atomic commands. In one example, the write pointers point to the first location after the last sector of the command. This location is typically the first erased sector in a meta-block, but can be a written sector in the case of write to update block with post-padding. One write pointer per Update needs to be stored. If an Update block has a partial page in Scratch Pad block, then the end of the partial page acts as the latest and valid write pointer pointing to the last sector of the command.

Multi-Sector Per Page Configurations

The command's Start sector, which can be stored in either Scratch Pad block or Update block, is marked, or pointed by a stored write pointer or index. This distinguishes it from pre-pad sectors.

Post Padding

In the case of writing a new data to an update block with post-padding of a page or meta-page, which can happen in the case of chaotic writes, the write pointer points to the first sector of the post pad. This make the first sector of the post pad look like the first sector of a new command. As the partial page to be post-padded comes from Scratch Pad block, the write pointer needs to be updated so that it starts pointing to the first post-pad sector. Alternatively, two sets of pointers may be kept—existing page level pointers for Update blocks only, and sector level ones, for partial page cases, which can point to either Update block or Scratch Pad page.

Forward Jump Case

In the case of forward jump in an Update block, which is similar to the post padding case, the first pad sector is marked as Start sector. The real start sector of the command does not have to be marked. As in the case of write abort, the roll back will be made to the beginning of the pad anyway. If the real Start sector is marked, then the roll back is made to the end of the pad, which makes no difference but this method increases number of control updates.

Write Abort Detection

If the write pointer does not point to the first erased sector in update block or Scratch Pad, the data roll back can be done as far as to the previous write pointer location.

Garbage Collection Write Abort Recovery

Unless Start sectors are marked by Write pointers only. The Start flags is cleared in all sectors to be copied during garbage collection so that in the case of Write Abort, they do not make copy data look like new data. The first sector to copy has a Start flag set, so that in the case of filling up Sequential Update block, the copy data look like a single command. In the case of write Abort, all copy data is discarded and roll back will be done to the last successfully written command data.

Long Command Write—Best Case Benchmark

In the case of a long command, the assumption is that it is acceptable to throw away as much data as necessary in order to make sure there is no corrupted data, which in one example is an amount equivalent to up to 6 meta-pages.

In order to minimise overhead, the write pointers are only updated when block list needs to be repopulated and EBM and GAT are updated. In this case, it maybe more efficient to store the write pointers in EBM sector.

Sequential Short Commands

If host writes by short commands logically adjacent to each other, then, optionally, only the start of the very first command can be marked as Start sector, so that the sequence of commands is recorded as a single long command. This can be done by clearing BUSY before write pointer updates, and if a new command comes within a short time after the previous, then skipping the write pointer update completely. The write pointer update is done after a pre-defined time in background. This is easy to do if Write Cache is enabled for host data.

A drawback is that the last write can look aborted if the host powers down soon after the end of the command. The detection of this case can be improved by setting an End of Command flag in the last sector's header.

Storage of Write Pointers

Update block pointers stored in Scratch Pad block can be used for atomic command marking. In this case, the granularity of such marking is at the sector level and updates are performed at the end of the atomic command.

Alternatively, the write pointers can be stored in EBM sector, so that number of control writes is reduced for the 'best case' write benchmark test. Additional SPB write may cause additional overhead. But, storage of the write pointers in EBM means additional EBM writes during Scratch Pad updates.

A compromise solution is the storage of write pointers in both EBM sector and Scratch Pad Index sector. In the case of Scratch Pad update, it will have the latest copy of the write pointer, in the case of EBM write, the valid pointers will be there. In order to be able to find the latest copy, there should be a cross-reference between EBM and Scratch Pad in a form of an EBM write pointer stored in Scratch Pad Index sector, or EBM, or both, to be defined.

Write Pointers Summary

Write pointers point to the sector following the last sector of the atomic command.

The write pointers are stored in EBM and SBPI, which do not have to be updated both at the time, so that number of additional writes is minimised Write pointer copies are synchronised cross-reference between EBM and SPB.

No additional overhead for the 'best case' long sequential write benchmark test, with exception of single write at the end of the command.

Short sequential writes can be 'glued' together to minimise overhead

The use of End of Command flag in a sector header can be used in addition to the write pointers as a weak indicator.

CONCLUSION

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of selectively protecting data stored in a nonvolatile memory array comprising:
- determining whether writing of an addressable unit of data having a first logical address to the nonvolatile memory array would endanger previously stored data in the nonvolatile memory array if the first addressable unit of data was stored in a first location;
- if the writing would endanger the previously stored data, then further determining if the endangered previously stored data contains, or is likely to contain, an earlier copy of the addressable unit of data having the first logical address; and
- selecting a data protection scheme for protecting the endangered previously stored data according to the further determination.

2. The method of claim 1 wherein the further determining includes determining if there is an addressable unit of data having the first logical address in the endangered previously stored data.

3. The method of claim 1 wherein the further determining includes determining whether the endangered previously stored data and the addressable unit of data are part of a sequential pattern of writing.

4. The method of claim 3 wherein a sequential pattern of writing is defined as a plurality of sequential addressable data packets written in response to a single write command or a plurality of sequential addressable data packets written in response to two or more write commands that are received within a predetermined time as established by a timer.

5. The method of claim 1 wherein a first data protection scheme is selected if the endangered previously stored data contains, or is likely to contain, an earlier copy of the addressable unit of data, the first data protection scheme including copying the earlier copy of the addressable unit of data to another location prior to writing the addressable unit of data.

6. The method of claim 1 wherein the data protection scheme includes copying a portion of the endangered previously stored data that contains, or is likely to contain, an earlier copy of the addressable unit of data only if another copy of the portion is not stored in the nonvolatile memory array.

7. The method of claim 3 wherein the further determining additionally includes, if it is determined that the endangered previously stored data and the addressable unit of data are not part of a sequential pattern of writing then examining the endangered previously stored data for an addressable unit of data having the first logical address.

8. A method of selectively protecting data stored in a nonvolatile memory array comprising:
- determining whether writing of an addressable unit of data having a first logical address to the nonvolatile memory array would endanger previously stored data in the nonvolatile memory array if the first addressable unit of data was stored in a first location;
- if the writing would endanger the previously stored data, then further determining if the endangered previously stored data contains an addressable unit of data with a logical address that matches the first logical address; and
- selecting a data protection scheme for protecting the endangered previously stored data according to the further determination.

9. The method of claim 8 wherein the first location is an upper page, the endangered previously stored data includes lower page data and the further determining includes examining the lower page data to see if it contains an addressable unit of data with a logical address that matches the first logical address.

10. A nonvolatile memory system comprising:
- a nonvolatile memory array; and
- a memory controller configured to:
  - determine whether writing of an addressable unit of data having a first logical address to the nonvolatile memory array would endanger previously stored data in the nonvolatile memory array if the first addressable unit of data was stored in a first location;
  - if the writing would endanger the previously stored data, then further determine if the endangered previously stored data contains an addressable unit of data with a logical address that matches the first logical address; and
  - select a data protection scheme for protecting the endangered previously stored data according to the further determination.

11. The nonvolatile memory system of claim 10 wherein the nonvolatile memory array is a multilevel cell array.

12. The nonvolatile memory system of claim 10 wherein the nonvolatile memory system is embodied in a removable memory card.

* * * * *